(12) United States Patent
Bach et al.

(10) Patent No.: US 8,797,507 B2
(45) Date of Patent: Aug. 5, 2014

(54) ILLUMINATION SYSTEM OF A MICROLITHOGRAPHIC PROJECTION EXPOSURE APPARATUS HAVING A TEMPERATURE CONTROL DEVICE

(75) Inventors: Florian Bach, Oberkochen (DE); Daniel Benz, Winnenden (DE); Severin Waldis, Aalen (DE); Armin Werber, Gottenheim (DE); Berndt Warm, Schwaig (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 259 days.

(21) Appl. No.: 13/044,160

(22) Filed: Mar. 9, 2011

(65) Prior Publication Data

US 2011/0181850 A1 Jul. 28, 2011

Related U.S. Application Data

(63) Continuation of application No. PCT/EP2009/006856, filed on Sep. 23, 2009.

(30) Foreign Application Priority Data

Sep. 29, 2008 (EP) .................................. 08017088

(51) Int. Cl.
*G03B 27/52* (2006.01)
*G03B 27/54* (2006.01)

(52) U.S. Cl.
USPC .................................. 355/67; 355/30; 355/55

(58) Field of Classification Search
CPC ............ G03F 7/70116; G03F 7/70141; G03F 7/70266; G03F 7/70291; G03F 7/70891; G03F 7/2008; G03F 7/7015; G03F 7/702
See application file for complete search history.

(56) References Cited

U.S. PATENT DOCUMENTS

2004/0036977 A1   2/2004   Tanaka et al.
2005/0018269 A1   1/2005   Weiss
(Continued)

FOREIGN PATENT DOCUMENTS

EP   0 532 236 A1   3/1993
EP   1 865 359        12/2007
(Continued)

OTHER PUBLICATIONS

The International Search Report for the corresponding PCT Application No. PCT/EP2009/006856, filed Nov. 30, 2009.

(Continued)

*Primary Examiner* — Peter B Kim
*Assistant Examiner* — Michelle Iacoletti
(74) *Attorney, Agent, or Firm* — Fish & Richardson P.C.

(57) ABSTRACT

An illumination system of a microlithographic projection exposure apparatus includes a primary light source, a system pupil surface and a mirror array. The mirror array is arranged between the primary light source and the system pupil surface. The mirror array includes a plurality of adaptive mirror elements. Each mirror element includes a mirror support and a reflective coating. Each mirror element is configured to direct light produced by the primary light source towards the system pupil surface. The mirror elements can be tiltably mounted with respect to a support structure. The mirror elements include structures having a different coefficient of thermal expansion and being fixedly attached to one another. A temperature control device is configured to variably modify the temperature distribution within the structures to change the shape of the mirror elements.

14 Claims, 9 Drawing Sheets

(56) References Cited

U.S. PATENT DOCUMENTS

| | | | |
|---|---|---|---|
| 2005/0018294 A1 | 1/2005 | Hauschild | |
| 2006/0077553 A1* | 4/2006 | Neilson | 359/566 |
| 2007/0165202 A1* | 7/2007 | Koehler et al. | 355/67 |
| 2007/0273722 A1 | 11/2007 | Sumi et al. | |
| 2007/0279535 A1 | 12/2007 | Fiolka | |
| 2007/0285638 A1 | 12/2007 | Ravensbergen et al. | |
| 2008/0079930 A1 | 4/2008 | Klarenbeek | |
| 2009/0153831 A1 | 6/2009 | Conradi et al. | |
| 2010/0195077 A1 | 8/2010 | Koehler et al. | |
| 2010/0201958 A1* | 8/2010 | Hauf et al. | 355/30 |
| 2010/0315615 A1 | 12/2010 | Klarenbeek | |
| 2011/0188016 A1 | 8/2011 | De Jager et al. | |

FOREIGN PATENT DOCUMENTS

| | | |
|---|---|---|
| EP | 1 890 191 | 2/2008 |
| JP | 2007-505488 | 3/2007 |
| JP | 2007-316194 | 12/2007 |
| JP | 2007-335859 | 12/2007 |
| JP | 2008-091907 A | 4/2008 |
| WO | WO 2004/092843 | 10/2004 |
| WO | WO 2004/092843 A2 | 10/2004 |
| WO | WO 2005/026843 A2 | 3/2005 |
| WO | WO 2005/078506 A2 | 8/2005 |
| WO | WO 2005/078522 | 8/2005 |
| WO | WO 2006/129864 A | 12/2006 |
| WO | WO 2008/023071 | 2/2008 |
| WO | WO 2010/032224 | 3/2010 |

OTHER PUBLICATIONS

Japanese Office Action, with translation, for corresponding JP Appl No. 2011-528238, dated Sep. 11, 2013.

* cited by examiner

ILLUMINATION SYSTEM OF A MICROLITHOGRAPHIC PROJECTION EXPOSURE APPARATUS HAVING A TEMPERATURE CONTROL DEVICE

CROSS-REFERENCE TO RELATED APPLICATIONS

This application is a continuation of, and claims benefit under 35 USC 120 to, international application PCT/EP2009/006856, filed Sep. 23, 2009, which claims benefit 35 USC 119 of European Application No. 08017088.9, filed Sep. 29, 2008. International application PCT/EP2009/006856 is hereby incorporated by reference in its entirety.

FIELD

The disclosure generally relates to illumination systems for illuminating a mask in microlithographic exposure apparatus, and in particular to systems including an array of mirrors.

BACKGROUND

Microlithography (also called photolithography or simply lithography) is a technology for the fabrication of integrated circuits, liquid crystal displays and other microstructured devices. The process of microlithography, in conjunction with the process of etching, is used to pattern features in thin film stacks that have been formed on a substrate, for example a silicon wafer. At each layer of the fabrication, the wafer is first coated with a photoresist which is a material that is sensitive to radiation, such as deep ultraviolet (DUV) light or soft X-ray radiation (EUV). Next, the wafer with the photoresist on top is exposed to projection light in a projection exposure apparatus. The apparatus projects a transmissive or reflective mask containing a pattern onto the photoresist so that the latter is only exposed at certain locations which are determined by the mask pattern. After the exposure the photoresist is developed to produce an image corresponding to the mask pattern. Then an etch process transfers the pattern into the thin film stacks on the wafer. Finally, the photoresist is removed. Repetition of this process with different masks results in a multi-layered microstructured component.

A projection exposure apparatus typically includes an illumination system for illuminating the mask, a mask stage for aligning the mask, a projection objective and a wafer alignment stage for aligning the wafer coated with the photoresist. The illumination system illuminates a field on the mask that may have the shape of a rectangular or curved slit, for example.

As the technology for manufacturing microstructured devices advances, there are ever increasing demands also on the illumination system. Ideally, the illumination system illuminates each point of the illuminated field on the mask with projection light having a well defined irradiance and angular distribution. The term angular distribution describes how the total light energy of a light bundle, which converges towards a particular point in the mask plane, is distributed among the various directions of the rays that constitute the light bundle.

The angular distribution of the projection light impinging on the mask is usually adapted to the kind of pattern to be projected onto the photoresist. For example, relatively large sized features may involve a different angular distribution than small sized features. The most commonly used angular distributions of projection light are referred to as conventional, annular, dipole and quadrupole illumination settings. These terms refer to the irradiance distribution in a system pupil surface of the illumination system. With an annular illumination setting, for example, only an annular region is illuminated in the system pupil surface. Thus there is only a small range of angles present in the angular distribution of the projection light, and thus all light rays impinge obliquely with similar angles onto the mask.

In EUV projection exposure apparatus the illumination system usually includes a mirror array (sometimes also referred to as faceted mirror) which directs the projection light produced by the EUV light source towards the system pupil surface so that a desired intensity distribution is obtained in the system pupil surface.

WO 2005/026843 A2 proposes for a DUV illumination system to use a mirror array that illuminates the pupil surface. For increasing the flexibility in producing different angular distribution in the mask plane, each of the mirrors can be tilted about two perpendicular tilt axes. A condenser lens arranged between the mirror array and the pupil surface translates the reflection angles produced by the mirrors into locations in the pupil surface. This known illumination system makes it possible to produce on the pupil surface a plurality of light spots, wherein each light spot is associated with one particular microscopic mirror and is freely movable across the pupil surface by tilting this mirror. It is also proposed to vary the size of the spots by using adaptive mirrors having a mirror surface whose shape can be varied to a limited extent using suitable actuators, for example piezoelectric actuators.

US 2005/0018269 A1 discloses a correction device which makes it possible to heat up certain portions of selected mirrors contained in a projection objective of a microlithographic exposure apparatus. To this end a light ray scans over the portions of the mirrors to be heated up. The device makes it possible to increase the temperature very selectively so that a desired, in particular a rotationally symmetric, temperature distribution can be achieved. In one embodiment the desired temperature distribution is determined such that the heated mirror changes its shape in a predetermined manner, thereby correcting aberrations produced in other optical elements of the objective.

WO 2004/092843 A2 discloses a correction device for a EUV projection objective of a microlithographic exposure apparatus that directs correction light to one of the large mirrors of the objective. The correction light is controlled such that the temperature in the vicinity of the reflective surface comes close to the temperature where the coefficient of thermal expansion of the mirror substrate is zero.

EP 0 532 236 A1 discloses another correction device for a EUV projection objective of a microlithographic exposure apparatus. In one embodiment infrared radiation is directed on one of the large mirrors of the objective. The infrared light is controlled such that the shape of the mirror does not substantially alter even under the impact of the high energy EUV projection light. In other embodiments heating or cooling devices are integrated into the mirror support for the same purpose.

The mirror array including adaptive mirrors as disclosed in the aforementioned WO 2005/026843 A2 is particularly advantageous because additional reflective power may be added to correct for non-ideal optical properties of a subsequent condenser, or for aberrations caused by material defects and manufacturing tolerances. However, the use of piezoelectric actuators proposed in this document has some significant drawbacks. In order to achieve a desired curvature of the mirror surface, it is desirable to provide a large number of such actuators which adds to the system complexity. For example, a very large number of electrical leads have to be provided for individually controlling the piezoelectric actuators. In a mirror array including several thousand mirror elements on a total area of less than 100 cm² the electrical wire density becomes critical. Apart from that it is difficult to obtain the desired surface shape of the mirror elements under varying temperature conditions.

SUMMARY

The present disclosure provides an illumination system which makes it possible to vary the spot shape of the light bundles produced by the mirror elements in a system pupil surface in a very accurate and variable fashion, while involving limited system complexity.

An illumination system can include a primary light source, a system pupil surface and a mirror array. The mirror array is arranged between the primary light source and the system pupil surface. The array includes a plurality of adaptive mirror elements, wherein each mirror element may be tiltably mounted with respect to a support structure. Each mirror element includes a mirror support and a reflective coating and is configured to direct light produced by the primary light source towards the system pupil surface. According to the disclosure the mirror elements include structures having a different coefficient of thermal expansion and being fixedly attached to one another. The illumination system further includes a temperature control device that is configured to variably modify the temperature distribution within the structures so as to change the shape of the mirror elements.

The disclosure thus exploits the effect that plates including materials having different coefficients of thermal expansion bend when the temperature changes, similar to bimetallic strips used for temperature controllers. The disclosure is furthermore based on the consideration that it is meanwhile possible to compute very accurately not only the temperature profile of mirror elements when heated or cooled at certain target areas, but also to predict the deformations occurring as a result of this temperature profile. In the context of the present disclosure this prediction has to take into account bending forces produced by the different coefficients of thermal expansion. However, bending forces produced by a non-homogeneous temperature profiles in the mirror elements may be taken into account, too.

In sophisticated mirror arrays such computations should be carried out anyway in order to prevent optical aberrations due to mirror deformations induced by the absorption of projection light. Thus, from a computational point of view, the temperature induced mirror adaptation according to the present disclosure does not substantially add to the system complexity.

From a hardware point of view, it has become apparent that it suffices to carefully heat or cool very few and/or small areas on the mirrors in order to produce a very large variety of different deformations with high accuracy. Significantly less wiring etc. is involved to control very few, for example 2 or 4, heater or cooler members as compared to the control of a large number of piezoelectric elements.

The disclosure relies only the mirror elements including structures having a different coefficient of thermal expansion and being fixedly attached to one another. Preferably the structures are planar or curved structures having a pair of parallel surfaces. Usually such structures exist anyway, because mirror elements typically include a mirror support and a reflective coating applied thereon, wherein both structures have different coefficients of thermal expansion. Since the effect of bending as a result of temperature changes becomes larger the greater the difference between the coefficients of thermal expansion is, the difference between the coefficients of thermal expansion should be substantial if a high sensitivity of the mirror elements to temperature changes is desired. Metals are a material class in which a wide variety of large coefficients of thermal expansion is available, and therefore the structures are made of metals in some embodiments.

The structures that produce the bending effect do not necessarily have to be the reflective coating and the mirror support, however. Since reflective coatings are usually formed by a stack of thin layers having alternate refractive indices and also different coefficients of thermal expansion, the bending effect produced by these layers after a change of the temperature profile may suffice to obtain the desired surface shape.

On the other hand, if a larger bending effect is desired, the contribution of the reflective coating may be insufficient. Then it may be considered to have a mirror support formed by a layer structure including at least two layers having different coefficients of thermal expansion.

In one embodiment the temperature control device includes heating or cooling members applied to the mirror support. With very few such heating or cooling members it is possible to produce complex deformations of the mirror element. Cooling and/or heating members may be formed by Peltier elements; heating members may include patterns of electrically conductive resistance wires which are directly applied to an underside of the mirror support.

The use of cooling members is particularly advantageous in EUV illumination systems in which the primary light source is configured to produce projection light having a wavelength below 50 nm, preferably below 25 nm, and most preferably between 13 and 14 nm. Since the mirror elements often have to be cooled anyway because a considerable portion of the impinging high energy EUV projection light is absorbed by the mirror elements and heats them up, the cooling may be performed in a locally resolved manner, i.e. different portions of the mirror elements are cooled to different extents. For example, the mirror elements may be provided with an array of Peltier elements which are controlled such that only those Peltier elements that are arranged on a certain area, which may have the contour of a stripe or an ellipse, for example, are operated and cool the adjacent portions of the mirror elements.

In a preferred embodiment the temperature control device includes a radiation system configured to selectively direct radiation to target areas on the reflective coating of the mirror elements. This makes it possible to change the shape of the mirror elements and thus to modify their reflective power without the need to accommodate any additional electrical components in the restricted space available for each mirror element. The radiation system thus provides for a kind of remote control for the shape of the mirror elements.

The reflective surface of the mirror elements on the one hand and the wavelength of the radiation produced by the radiation system should be determined such that the reflective surface is absorbent for the radiation. This ensures a maximum heating effect and simultaneously reduces undesired effects produced by reflected radiation.

The radiation system may include a diaphragm including an arrangement of apertures corresponding to the desired target areas on the mirror support. The diaphragm is illuminated by a radiation source and imaged onto the mirror array such that only the target areas are illuminated by the radiation. By inserting different diaphragms it is even possible to vary the target areas which are exposed to the radiation. It is also possible to have different target areas for different mirror elements by suitably determining the apertures in the diaphragm.

Target areas that can be varied individually for each mirror element may be more easily provided for if the radiation system includes a secondary light source producing a radiation beam and a spatial light modulator that is configured to move the radiation beam over the target areas. In this case the target areas are "written" by a moving radiation beam. If desired, any arbitrary target area may be heated on any of the mirror elements by suitably controlling the spatial light modulator. Such a radiation system is particularly suitable in embodiments in which the target areas are line patterns. It may be desirable to provide more than one secondary light source and spatial light modulator in order to ensure that each mirror element is heated up with a sufficiently high refresh rate.

In one embodiment the mirror elements have concave mirror surfaces, and the temperature control device is configured to modify the temperature distribution within the structures such that the mirror elements have different focal lengths in two orthogonal planes. Such astigmatic mirror elements are particularly advantageous because this suppresses aberrations that would otherwise be present if spherical mirrors reflect light impinging at large angles of incidence.

Astigmatically deformed mirror elements are particularly useful in EUV illumination systems. Then, without causing significant aberrations, the optical axes of the mirror elements are allowed (irrespective of their tilting angles) to form an angle of more than 20°, preferably of more than 30°, with an optical axis of a mirror which immediately precedes the mirror array in a light propagation direction. A larger deviation of the projection light beam makes it possible to arrange the optical elements of the illumination system in more advantageous and convenient manner, in particular with regard to mounting technology and space issues.

For example, an axis of symmetry, which is associated with the light source, may then form an angle of less than 45°, preferably of less than 20°, with respect to a horizontal plane. In such a configuration the bulky light source does not have to be arranged in a basement of the semiconductor facility or very high above the remaining parts of the illumination system, but can be conveniently arranged side by side to the mirrors of the EUV illumination system.

Producing the astigmatic shape of the mirror elements with the help of the temperature control system is advantageous because it is difficult and costly to produce a large number of astigmatic mirror elements for the array. If a temperature control system is provided anyway for additionally varying the spot shapes in the system pupil surface, it is simpler and cheaper to use spherical or at least rotationally symmetrical mirrors and use the temperature control system also for producing the astigmatic shape for allowing large deviation angles. However, it is to be understood that the mirror elements could have the desired astigmatic effect also initially, i.e. not as a result of a deformation achieved with the help of the temperature control system.

In this case the illumination system includes a mirror array which is arranged between a light source and a system pupil surface. The array includes a plurality of mirror elements, wherein each mirror element is tiltably mounted with respect to a support structure and is configured to direct light produced by the primary light source towards the system pupil surface. The mirror elements have concave astigmatic mirror surfaces, i.e. the mirror elements have different focal lengths in two orthogonal planes. It is not mandatory to provide also a temperature control device.

In one embodiment the mirror elements include heat barriers which have a lower coefficient of thermal conduction than the materials which are arranged on either side of the heat barriers. Such heat barriers ensure that the heat or the cold produced at the target areas and the adjacent material remains confined to this portion of the mirror elements over a longer period of time. In other words, the temperature difference between the target areas and the adjacent material on the one hand and the surrounding material on the other hand does not decrease too quickly. This makes it possible to reduce the refresh rate at which the target areas have to be heated or cooled by the temperature control device in order to ensure stable optical properties of the mirror elements.

BRIEF DESCRIPTION OF THE DRAWINGS

Various features and advantages of the present disclosure may be more readily understood with reference to the following detailed description taken in conjunction with the accompanying drawings in which.

DESCRIPTION OF THE PREFERRED EMBODIMENTS

I. General Structure of Projection Exposure Apparatus

Figure 1:
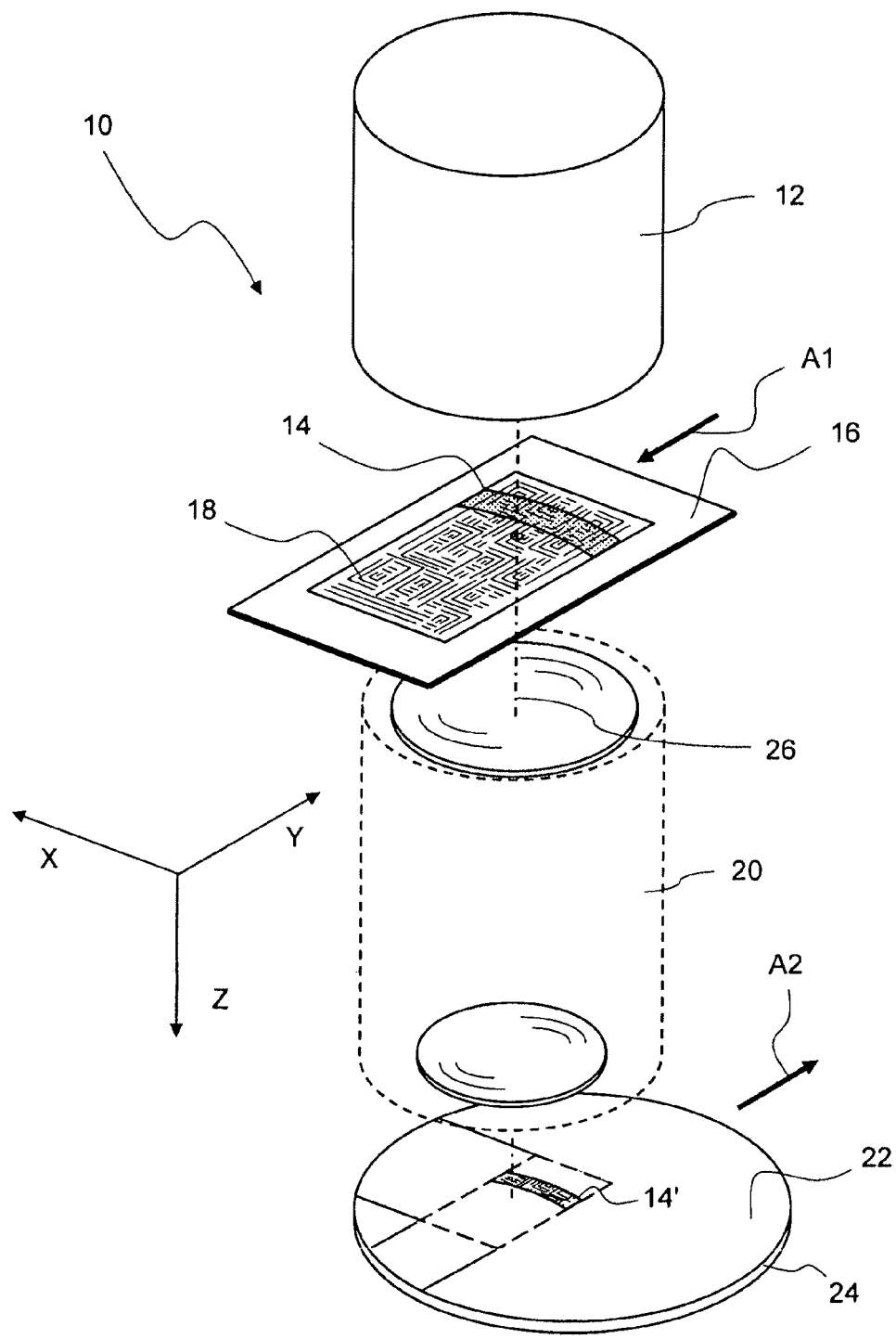
FIG. 1 is a perspective and considerably simplified view of a projection exposure apparatus in accordance with the present disclosure.

FIG. 1 is a perspective and highly simplified view of a projection exposure apparatus 10 that includes an illumination system 12 for producing a projection light beam. The projection light beam illuminates a field 14 on a mask 16 containing minute structures 18. In this embodiment the illuminated field 14 has approximately the shape of a ring segment. However, other, for example rectangular, shapes of the illuminated field 14 are contemplated as well.

A projection objective 20 images the structures 18 within the illuminated field 14 onto a light sensitive layer 22, for example a photoresist, which is deposited on a substrate 24. The substrate 24, which may be formed by a silicon wafer, is arranged on a wafer stage (not shown) such that a top surface of the light sensitive layer 22 is precisely located in an image plane of the projection objective 20. The mask 16 is positioned using a mask stage (not shown) in an object plane of the projection objective 20. Since the latter has a magnification of less than 1, a minified image 14' of the structures 18 within the illuminated field 14 is projected onto the light sensitive layer 22.

During the projection, the mask 16 and the substrate 24 move along a scan direction which coincides with the Y direction. Thus the illuminated field 14 scans over the mask 16 so that structured areas larger than the illuminated field 14 can be continuously projected. Such a type of projection exposure apparatus is often referred to as "step-and-scan apparatus" or simply a "scanner". The ratio between the velocities of the mask 16 and the substrate 24 is equal to the magnification of the projection objective 20. If the projection objective 20 inverts the image, the mask 16 and the substrate 24 move in opposite directions, as this is indicated in FIG. 1 by arrows A1 and A2. However, the present disclosure may also be used in stepper tools in which the mask 16 and the substrate 24 do not move during projection of the mask.

In the embodiment shown, the illuminated field 14 is not centered with respect to an optical axis 26 of the projection objective 20. Such an off-axis illuminated field 14 may be desirable with certain types of projection objectives 20. In other embodiments, the illuminated field 14 is centered with respect to the optical axis 26.

II. General Structure and Function of Illumination System

Figure 2:
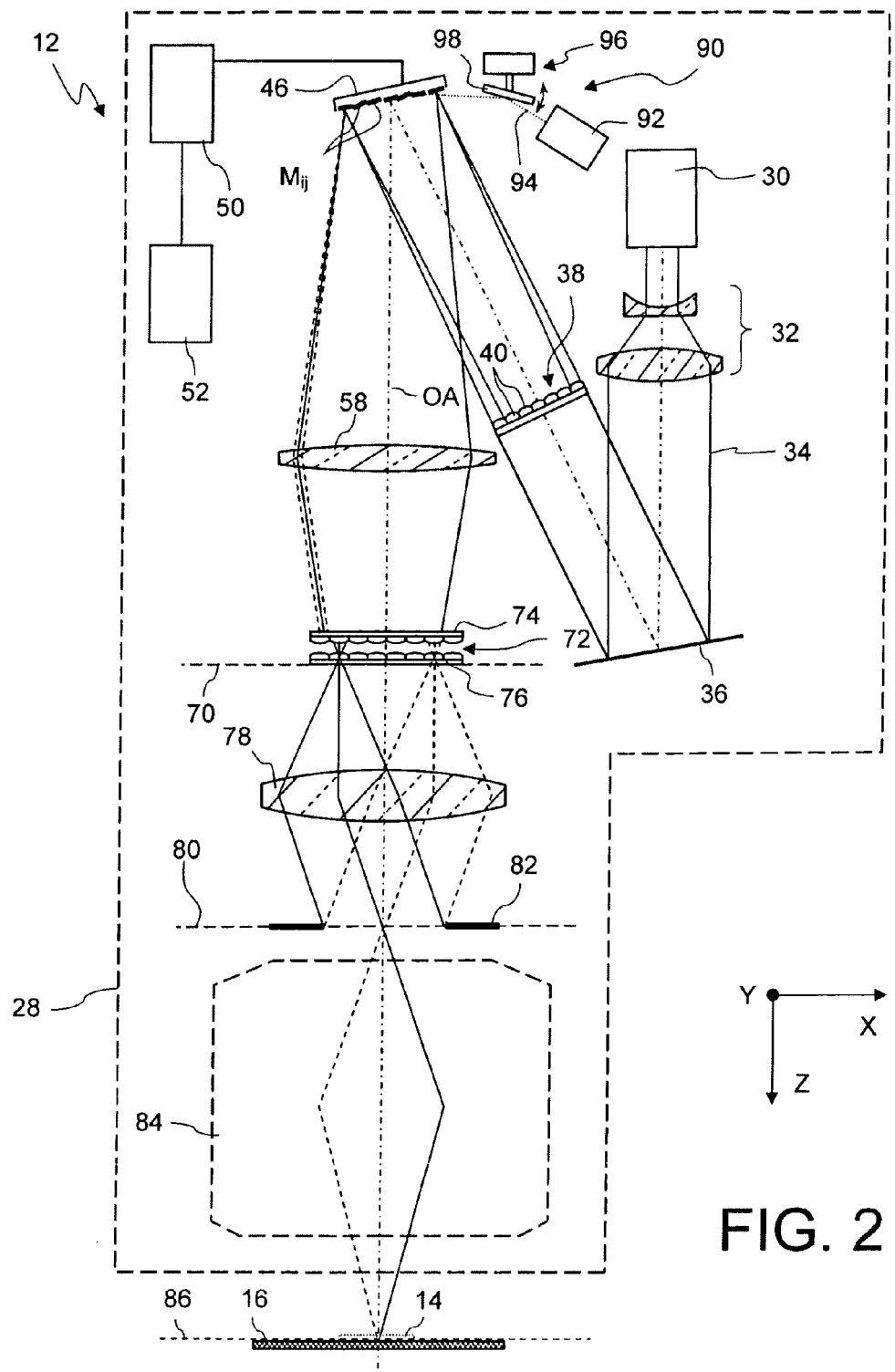
FIG. 2 is a meridional section through an illumination system contained in the projection exposure apparatus shown in FIG. 1.

FIG. 2 is a more detailed meridional section through the illumination system 12 shown in FIG. 1. For the sake of clarity, the illustration of FIG. 2 is considerably simplified and not to scale. This particularly implies that different optical units are represented by very few optical elements only. In reality, these units may include significantly more lenses and other optical elements.

The illumination system 12 includes a housing 28 and a light source that is, in the embodiment shown, realized as an excimer laser 30. The excimer laser 30 emits projection light that has a wavelength of about 193 nm. Other types of light sources and other wavelengths, for example 248 nm or 157 nm, are also contemplated.

In the embodiment shown, the projection light emitted by the excimer laser 30 enters a beam expansion unit 32 in which the light beam is expanded without altering the geometrical optical flux. The beam expansion unit 32 may include several lenses as shown in FIG. 2, or may be realized as a mirror arrangement, for example. The projection light emerges from the beam expansion unit 32 as a substantially collimated beam 34. In other embodiments, this beam may have a significant divergence. The collimated beam 34 impinges on a plane folding mirror 36 provided for reducing the overall dimensions of the illumination system 12.

Figure 5:
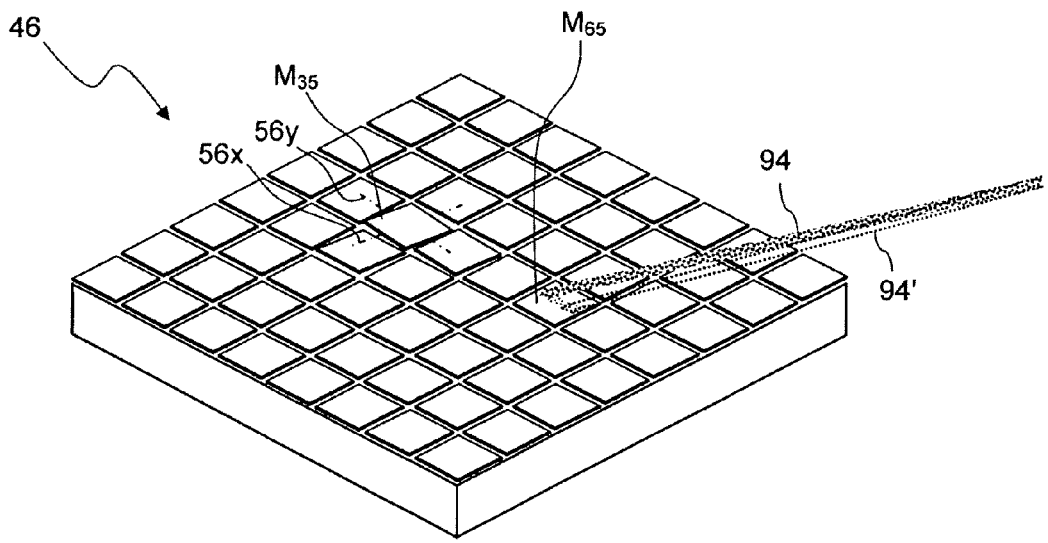
FIG. 5 is a perspective view of a mirror array on which a laser beam is directed to a target area.

After reflection from the folding mirror 36, the beam 34 impinges on an array 38 of microlenses 40. A mirror array 46 is arranged in or in the vicinity to a back focal plane of the microlenses 40. As is also shown in FIG. 5, the mirror array 46 includes a plurality of small adaptive mirror elements $M_{ij}$ that can be tilted, independently from each other, around two tilt axes $56x$, $56y$ (see FIG. 5) that are preferably aligned perpendicularly to each other. The total number of mirror elements $M_{ij}$ may exceed 100 or even several 1000. The mirror surfaces may be provided with diffractive structures. In this embodiment the number of mirror elements $M_{ij}$ is equal to the number of microlenses 40 contained in the microlens array 38. Thus each microlens 40 directs a converging light bundle on one mirror element $M_{ij}$ of the mirror array 46.

The mirror elements should be manufactured with very high precision. A high accuracy may be achieved by applying or removing material from a pre-form, by a moulding process using dies or involving galvanic effects, or using lithographic processes.

The tilting movements of the individual mirror elements $M_{ij}$ are controlled by a mirror control unit 50 which is connected to an overall system control 52 of the illumination system 12. Actuators that are used to set the desired tilt angles of the mirror elements $M_{ij}$ receive control signals from the mirror control unit 50 such that each individual mirror element $M_{ij}$ is capable of reflecting an impinging light ray by a reflection angle that is variable in response to the control signal. In the embodiment shown there is a continuous range of tilt angles at which the individual mirror elements $M_{ij}$ can be arranged. In other embodiments, the actuators are configured such that only a limited number of discrete tilt angles can be set.

The light bundles reflected from the mirror element $M_{ij}$ impinge on a first condenser 58 which ensures that the slightly diverging light bundles impinge, now as at least substantially parallel light bundles, on an optical integrator 72 which produces a plurality of secondary light sources. The optical integrator 72 increases the range of angles formed between the light rays and an optical axis OA of the illumination system 12. In other embodiments, the first condenser 58 is dispensed with so that the light bundles impinging on the optical integrator 72 have a larger divergence.

The optical integrator 72 is realized, in the embodiment shown, as a fly's eye lens including two substrates 74, 76 that each includes two orthogonal arrays of parallel cylindrical microlenses. Other configurations of the optical integrator are envisaged as well, for example integrators including an array of microlenses that have rotationally symmetrical surfaces, but rectangular boundaries. Reference is made to WO 2005/078522 A, US 2004/0036977 A1 and US 2005/0018294 A1, in which various types of optical integrators suitable for the illumination system 12 are described.

Reference numeral 70 denotes a system pupil surface of the illumination system 12 that substantially defines the angular distribution of the light impinging on the mask 14. The system pupil surface 70 is usually plane or slightly curved and is arranged in or in immediate vicinity to the optical integrator 72. As the angular light distribution in the system pupil surface 70 directly translates into an intensity distribution in a subsequent field plane, the optical integrator 72 substantially determines the basic geometry of the illuminated field 14 on the mask 16. Since the optical integrator 72 increases the range of angles considerably more in the X direction than in the scan direction Y, the illuminated field 14 has larger dimensions along the X direction than along the scan direction Y.

The projection light emerging from the secondary light sources produced by the optical integrator 72 enters a second condenser 78 that is represented in FIG. 2 by a single lens only for the sake of simplicity. The second condenser 78 ensures a Fourier relationship between the system pupil surface 70 and a subsequent intermediate field plane 80 in which a field stop 82 is arranged. The second condenser 78 superimposes the light bundles, which are produced by the secondary light sources, in the intermediate field plane 80, thereby achieving a very homogenous illumination of the intermediate field plane 80. The field stop 82 may include a plurality of movable blades and ensures sharp edges of the illuminated field 14 on the mask 16.

A field stop objective 84 provides optical conjugation between the intermediate field plane 80 and the mask plane 86 in which the mask 16 is arranged. The field stop 82 is thus sharply imaged by the field stop objective 84 onto the mask 16. The field stop 82 and the field stop objective 84 may be dispensed with in other embodiments.

As has been mentioned above, the intensity distribution in the system pupil plane 70 translates into an angular distribution in the subsequent intermediate field plane 80. If the field stop objective 84 has a magnification of 1, the angular distribution and the intermediate field plane 80 appears again (in the absence of aberrations introduced by the field stop objective 84) in the mask plane 86; if the absolute value of the magnification is distinct from 1, the angular distribution is scaled up or down. Thus it is possible to vary the angular distribution in the mask plane 86 by modifying the intensity distribution in the system pupil plane 70 with the help of the mirror array 46.

If the angular distribution (i.e. the illumination setting) shall be changed, the individual mirror elements $M_{ij}$ of the mirror array 46 are tilted in such a way that the spots produced by each individual mirror element $M_{ij}$ assemble in the system pupil plane 70 to a pattern that corresponds to the desired intensity distribution.

If the mirror elements $M_{ij}$ have a plane reflective surface, the shape of the spots produced in the system pupil plane 70 mainly depends on the refractive power of the micro-lenses 40 and the divergence of the beam 34 impinging thereon. The light bundles emerging from the mirror elements $M_{ij}$ have a divergence which is more or less independent on the tilting angles that characterize the spatial orientation of the mirror elements $M_{ij}$. Thus the light bundles passing through the first condenser lens 58 have at least substantially the same diameter and divergence.

However, the condenser lens 58 does not have ideal optical properties. This implies, for the embodiment shown, that perfect collimation of the light bundles reflected from the mirror elements $M_{ij}$ cannot be accomplished for each and every light bundle. Instead, the collimating effect will at least slightly depend on the location where, and the direction from which, a light bundle impinges on the condenser 58.

As a result, some of the light bundles emerging from the condenser 58 will not be collimated, but may slightly converge or diverge. Consequently, the diameter (i.e. spot size) of the light bundles in the system pupil surface 70 will also slightly vary. These deviations will result in an intensity distribution in the system pupil plane 70 which deviates from the desired intensity distribution. If these deviations exceed certain limits, intolerable deviations of the angular distribution in the mask plane 86 may be observed.

Similar considerations also apply if the first condenser 58 is designed to produce not collimated, but diverging or converging light bundles. Non-ideal optical properties of the first condenser 58 may again result in a degraded intensity distribution in the system pupil surface 70, and thus a poorer angular distribution in the mask plane 86.

In order to avoid such undesired effects, the mirror elements $M_{ij}$ of the mirror array 46 are adaptive. Thus the shape of the mirror elements can be changed so as to alter their reflective power. By increasing or decreasing the reflective power, it is possible to vary the divergence of the reflected beams. If a mirror element $M_{ij}$ directs a beam towards the centre of the first condenser 58, the desired reflective power may have to be different if compared to a situation in which the mirror element $M_{ij}$ directs a beam towards the circumference of the first condenser 58.

A change of the shape of the mirror elements may also be advantageous if other undesired, including time variant, optical effects cause a degradation of the angular distribution in the mask plane 86. For example, changes in the refractive power of the microlenses 40 may occur as a result of the heating caused by the absorption of projection light. Changes of the shape of the mirror elements $M_{ij}$ may also be helpful in order to correct aberrations introduced by manufacturing tolerances.

In the following various embodiments will be described that relate to a temperature control device that is used to change the shape of the mirror elements $M_{ij}$.

III. Temperature Control Device

The illumination system 12 includes, accommodated within its housing 28, a temperature control device 90 including, according to a first embodiment, an infrared laser source 92, which produces a laser beam 94. The temperature control device 90 further includes a spatial light modulator 96 which is configured to move the laser beam 94 over target areas on the mirror elements $M_{ij}$. In this embodiment the spatial light modulator 96 includes a tiltable mirror 98 which can be tilted about two orthogonal axes with the help of suitable actuators. Such a tiltable mirror 98 may also be realized using MEMS technology, as it is described in WO 2005/078506 A2 filed by Microvision. With the help of the tiltable mirror 98 it is possible to direct the laser beam 94 on any arbitrary point on the mirror array 46 by suitably tilting the mirror 98. In alternative embodiments the spatial light modulator 96 includes combinations of rotatable prisms or electro-optical elements that make it possible to change the direction of a light beam passing through the elements by varying a voltage applied to the elements.

The spatial light modulator 96 is controlled in such a way that the laser beam 94 moves continuously or intermittently over target areas on the mirror elements $M_{ij}$. The wavelength of the laser light is selected such that it is almost completely, or at least by more than 80%, absorbed by the mirror elements. The absorbed laser light results in an increase of the temperature within the target areas to which the laser light has been directed by the spatial light modulator 96.

Figure 3:
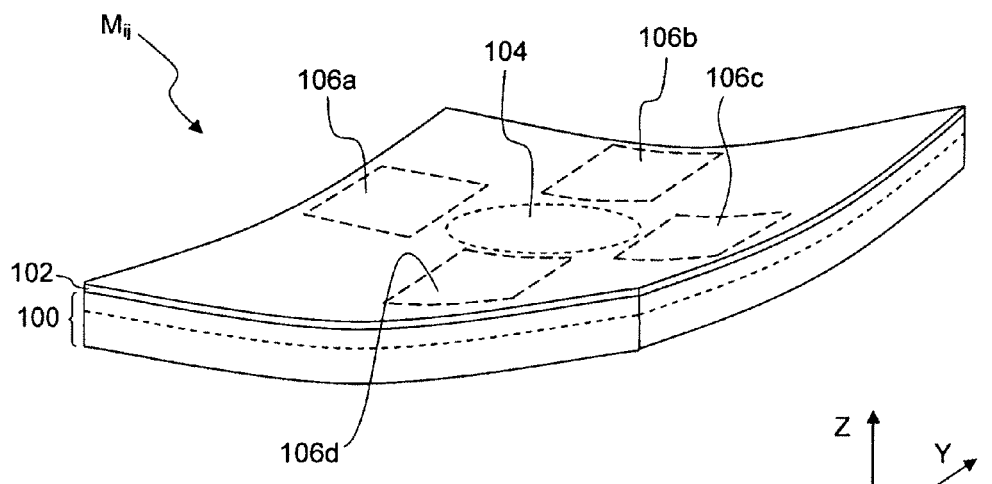
FIG. 3 is a perspective view of a mirror element contained in the illumination system shown in FIG. 2.

This is illustrated in FIG. 3 which is an enlarged and perspective view of a single mirror element $M_{ij}$. The mirror element $M_{ij}$ includes a mirror support 100 and a reflective coating 102 which is applied on top of the mirror support 100. The reflective coating 102 may be formed by a plurality of thin layers having alternating refractive indices, for example. The reflective coating is specifically adapted to the wavelength of the projection light so as to ensure maximum reflection for this wavelength. For infrared radiation, as it is produced by the laser source 92, such reflective coatings are usually almost completely absorptive.

The mirror support 100 may itself be formed by two or more individual parallel structures that are fixedly attached to one another, as is indicated with dashed lines in FIG. 3.

Reference numeral 104 denotes a projection light area on the reflective coating 102 on which projection light impinges during operation of the illumination system 12. Adjacent along the X and the Y direction target areas 106a, 106b, 106c and 106d are indicated on which the laser beam 94 is directed. In other embodiments the projection light area 104 is substantially larger than shown in FIG. 3, and the target areas 106a to 106d may partially or completely overlap the projection light area 104. Absorption of the infrared radiation in the target areas 106a to 106d results in an increase of the temperature in the vicinity to the target areas 106a to 106d.

Figure 4A:
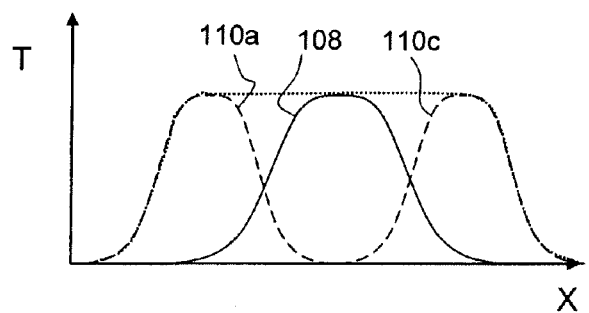
FIGS. 4a and 4b are temperature profiles in the mirror element of FIG. 3 along an X and a Y direction.
Figure 4B:
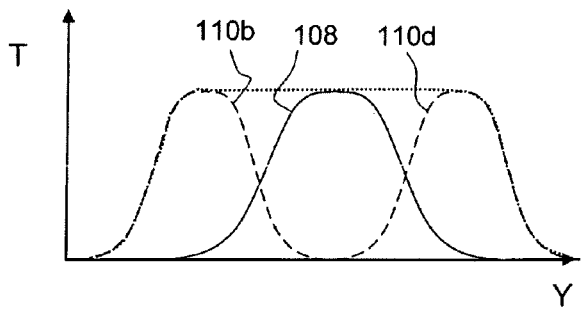

This is illustrated in the graphs of FIGS. 4a and 4b showing the temperature profiles in the mirror element $M_{ij}$ along the X and Y directions. The solid line 108 indicates the temperature profiles produced solely by the projection light impinging on the projection light area 104. Although the reflective coating 102 has a high reflectivity for the projection light, the small amount of absorbed light results in a increase of the temperature as indicated with solid lines 108 in FIGS. 4a and 4b. In FIG. 4a the broken lines 110a and 110c indicate the temperature profiles produced solely by the infrared radiation impinging on the opposing target areas 106a and 106c, respectively. In FIG. 4b the broken lines 110b and 110d indicate the temperature profiles produced solely by the infrared radiation impinging on the opposing target areas 106b and 106d, respectively. The total temperature profiles obtained by adding the aforementioned profiles are indicated with dotted lines.

The reflective coating 102 and the mirror support 100 have different coefficients of thermal expansion. With the temperature profiles shown in FIGS. 4a and 4b, a similar effect is achieved as with two bimetallic strips arranged in a crossing arrangement. Consequently, the mirror element $M_{ij}$ starts bending with respect to two orthogonal bending axes extending along the X and Y direction when the temperature profiles shown in FIGS. 4a and 4b build up.

In FIG. 3 it is assumed that the coefficient of thermal expansion of the mirror support 100 is greater than the coefficient of thermal expansion of the reflective coating 102. Then a temperature rise will result in a concave bending of the mirror element $M_{ij}$ as illustrated.

As a result of the cross-like arrangement of the heated areas 104 and 106a to 106d, the bending is at least substantially rotationally symmetrical. Thus a positive reflective power identical along the X and the Y direction is produced by directing the laser beam 94 onto the mirror element $M_{ij}$ with the help of the spatial light modulator 96. This reflective power may help to keep the spot shape of the reflected beam in the system pupil plane 70 constant if the mirror element $M_{ij}$ is substantially tilted.

FIG. 5 is a perspective view of the mirror array 46. A mirror element $M_{35}$ is shown in a position in which it has been tilted about two orthogonal tilt axes 56x and 56y. The laser beam 94 is directed onto a different mirror element $M_{65}$. Dotted lines 94' indicate the laser beam 94 at a later point in time after it has been directed across the reflective coating 102 of the mirror element $M_{65}$ along a substantially straight line.

As a matter of course, various other deformations may be produced by heating target areas on the mirror elements $M_{ij}$. If the coefficient of thermal expansion of the reflective coating is not smaller but greater than the coefficient of thermal expansion of the mirror support 100, a temperature rise will result in a convex bending of the mirror element $M_{ij}$. It is also possible to manufacture the mirror element such that it has at room temperature a substantial curvature, and this curvature is reduced by increasing the temperature with the help of the temperature control device 90.

Figures 6A, 6B:
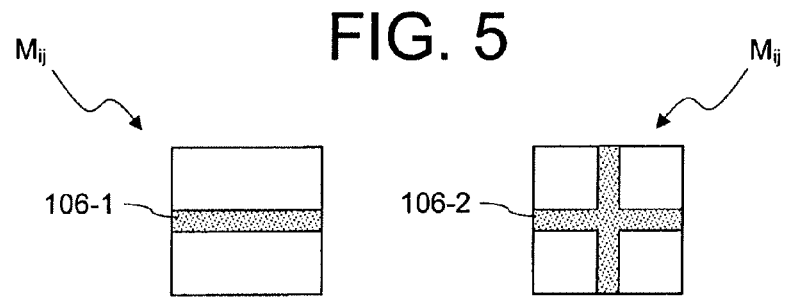
FIGS. 6a to 6d are different target areas subjected to heating radiation on a mirror element.

The change of the shape of the mirror element $M_{ij}$ substantially depends, among others, on the size and location of the target areas illuminated by the infrared radiation. FIGS. 6a to 6d show different target areas that may be produced on the mirror elements $M_{ij}$:

FIG. 6a illustrates a target area 106-1 which has the geometry of an elongated stripe symmetrically separating the square mirror surface in two equal halves. If the temperature is increased in the vicinity of this target area 106-1, the mirror element $M_{ij}$ will bend only about a direction which is orthogonal to the longitudinal direction of the stripe. Such a deformation may be useful to correct astigmatic effects in the illumination system 12.

The target area 106-2 shown in FIG. 6b is similar to the target areas 106a to 106d shown in FIG. 3. Consequently, the mirror element $M_{ij}$ will similarly change its shape if infrared radiation is directed to the target area 106-2. Since additional heat is produced at the centre of the mirror element $M_{ij}$, the resulting curvature profile will be slightly different.

Figures 6C, 6D:
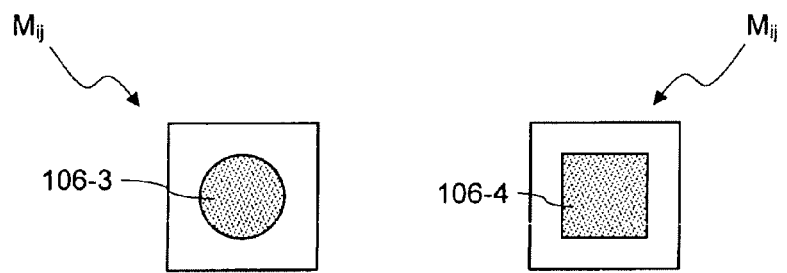

The target areas shown in FIGS. 6a and 6b have the advantages that they may be described as line patterns which are simply to produce with the moving laser beam 94. FIG. 6c shows a target area 106-3 having the geometry of a circular disc. Such a disc will produce the most rotationally symmetrical bending forces.

FIG. 6d shows a target area 106-4 which will also result in an at least substantially rotationally symmetric bending of the mirror element $M_{ij}$, but with a slightly different curvature profile as compared to the embodiments shown in FIGS. 3, 6b and 6c.

The deformation of the mirror elements $M_{ij}$ obtained by increasing the temperature in the target areas 106 also depends on any internal stress present in the mirror support 100 and the reflective coating 102. For example, it is possible to produce the layers forming the reflective coating 102 such that a mechanical stress remains after the manufacturing process. Such a stress may be released or increased by increasing the temperature in the layers. By suitably selecting the directions of the mechanical stress, it is possible to influence the deformations that are obtained after changing the temperature in the target areas 106.

In the foregoing it has been assumed that all mirror elements $M_{ij}$ are heated up in the same manner with the help of the temperature control device 90. In many cases, however, it will be desirable to produce different deformations of the mirror elements $M_{ij}$ depending on their position within the mirror array 46. For example, it may be desirable to increase the reflective power of the mirror elements the more they are spaced apart from the centre of the mirror array 46.

Figure 7:
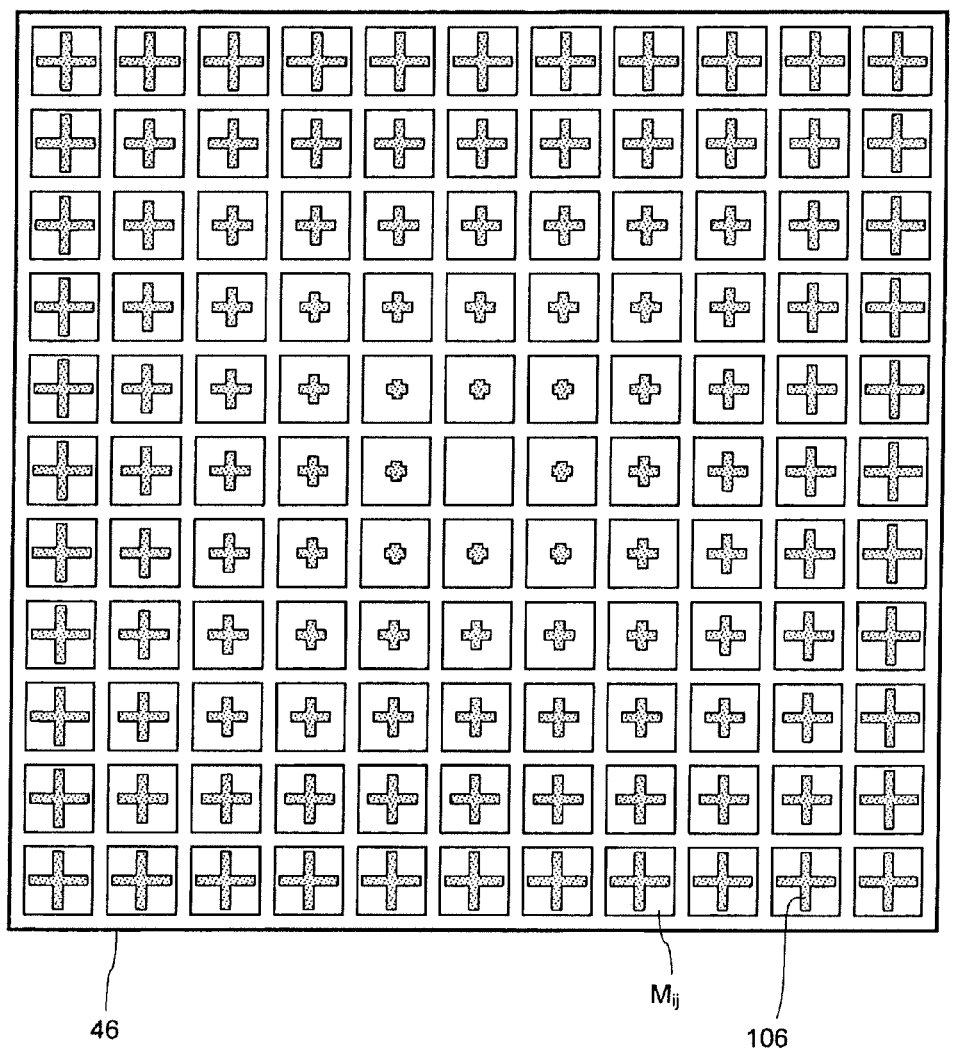
FIG. 7 is a top view on a mirror array illustrating an operation in which different target areas are associated with different groups of mirror elements.

An exemplary configuration of such target areas 106 is illustrated in FIG. 7. The mirror array 46 of this embodiment includes 121 mirror elements $M_{ij}$ arranged in a rectangular grid pattern. Here it is assumed that the central mirror element $M_{ij}$ shall not be deformed at all. Almost rotationally symmetrical deformations shall be produced in all other mirror elements with the help of the temperature control device 90, wherein the curvature shall increase with increasing distance from the centre of the mirror array 46. Consequently, the target areas 106 are getting larger the more the mirror elements $M_{ij}$ are spaced apart from the centre.

The laser beam 94 may also be used to modify the reflective properties of the reflective coating 102. If the laser beam 94 remains sufficiently long at a particular location on the mirror element $M_{ij}$, the temperature will rise to an extent such that the reflectivity of the reflective coating decreases substantially. Such a deliberate reduction of the reflectivity of the reflective coating 102 may be useful if the projection light, for example as a result of beam inhomogeneities, has produced similar degradations in the area 104 exposed to projection light. The laser beam 94 may then ensure that a uniform (although lower) reflectivity is regained in a portion of the area 104.

It is also possible to deliberately produce reductions of the reflectivity in order to produce desired optical effects on the intensity and angular distribution of projection light in the system pupil surface 70. Such reductions may be transient or permanent.

IV. Alternative Embodiments

Figure 8:
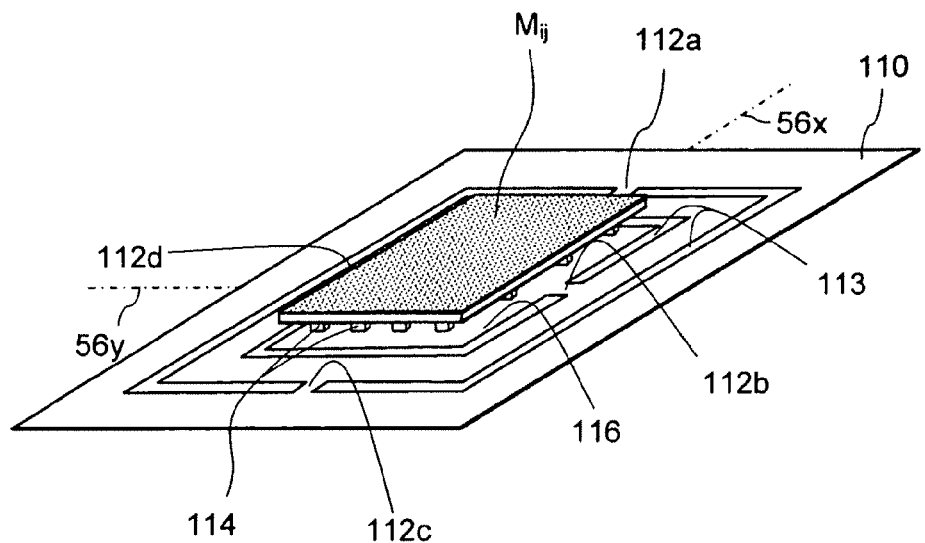
FIG. 8 is a perspective view of a mirror element according to another embodiment in which heating members are applied to an underside of a mirror support.

FIG. 8 is a perspective view of a mirror element $M_{ij}$ according to another embodiment. The mirror element $M_{ij}$ is connected to a carrier structure 110 with the help of solid state articulations 112a, 112b, 112c and 112d. These articulations 112a, 112b, 112c and 112d are formed by bridges that remain in the carrier structure 110 after longitudinal slits 113 have been produced. For the sake of simplicity actuators configured to tilt the mirror element $M_{ij}$ around tilt axes 56x, 56y defined by opposing pairs of articulations 112a, 112c and 112b, 112d, respectively, are not shown in FIG. 8.

In this embodiment the temperature control device 90 includes a plurality of heating members 114 which connect the mirror element $M_{ij}$ to a carrier plate 116 which is also defined by slits 113 in the carrier structure 110. The heating members 114 can be individually driven so that almost any arbitrary temperature profile can be produced in the mirror element Also Also in this embodiment structures contained in the mirror element $M_{ij}$ and having different coefficients of thermal expansion ensure that the temperature profile produced in the mirror element $M_{ij}$ results in a deformation that modifies the optical properties of the mirror element $M_{ij}$.

Figure 9:
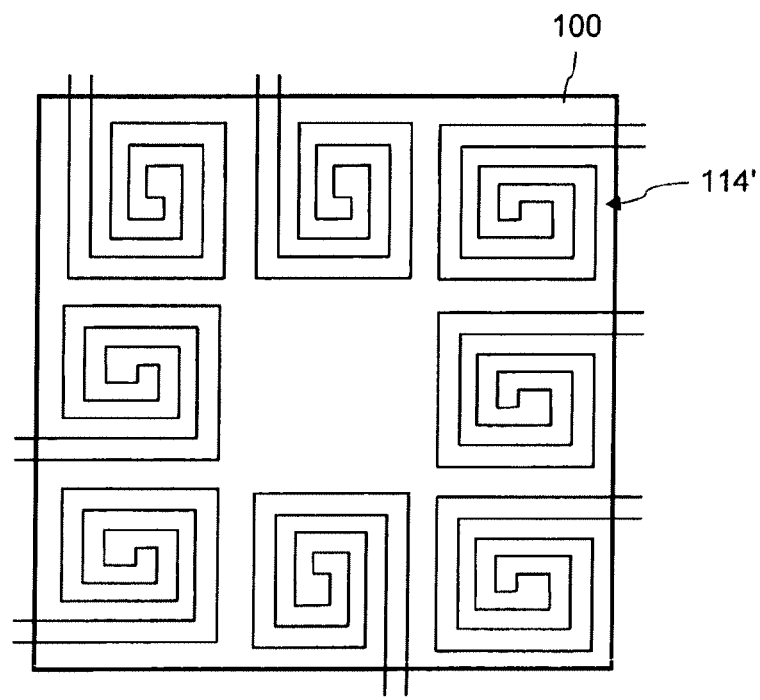
FIG. 9 is a bottom view on a mirror support on which electrically conductive resistance wires used as heating members are applied.

In FIG. 8 the heating members 114 are represented as small blocks that heat up if an electric voltage is applied. In an alternative embodiment the heating members are formed by patterns of electrically conductive resistance wires, as is shown in the bottom view of a mirror support 100 of FIG. 9. Here heating wires 114' are arranged over the bottom surface of the mirror support 100 and can individually be connected to a voltage source so that various temperature profiles can be produced in the mirror element $M_{ij}$.

Figure 10:
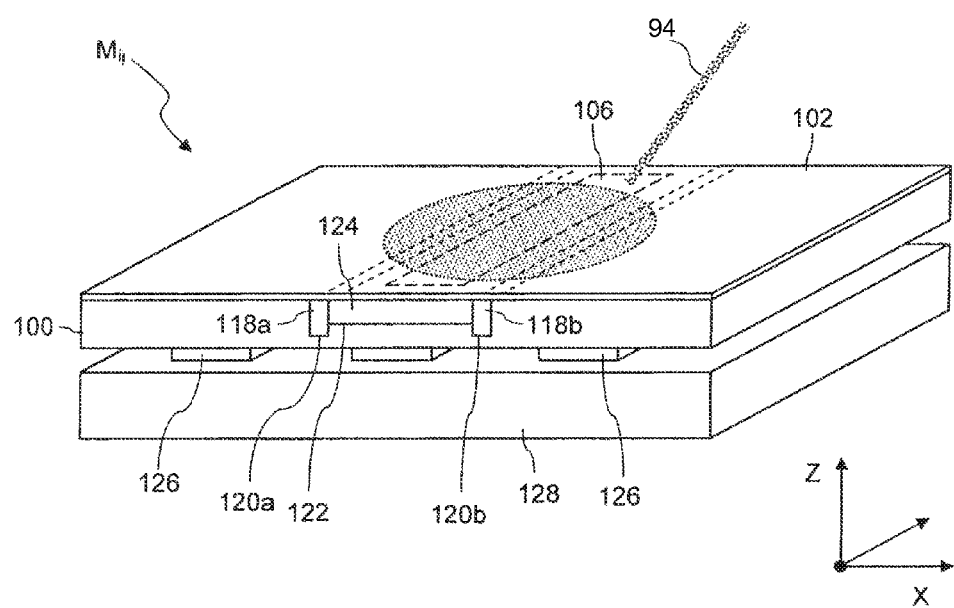
FIG. 10 is a perspective view of a mirror element according to an embodiment in which the mirror elements include heat barriers.

In the embodiment shown in FIG. 10 the mirror elements $M_{ij}$ include two parallel heat barriers 118a, 118b that extend, in the embodiment shown, along a Y direction over the entire length of the mirror elements $M_{ij}$. The heat barriers 118a, 188b have a rectangular cross section and are formed by a material, for example $SiO_2$, having a lower coefficient of thermal conduction than the materials, for example Si, on either side of the heat barriers 118a, 118b. The thermally isolating material of the heat barriers 118a, 118b is received in first and second grooves 120a, 120b that may have been formed by etching in a mirror support 100. Between the first and second grooves 120a, 120b a lower and broader third groove 122 is formed. The coefficient of thermal expansion of the material 124 filling the third groove 122 and the surrounding material of the mirror support 100 is different.

If a target area 106 is illuminated by a laser beam 94, heat will be produced in the target area 106, and this locally produced heat will have a tendency to distribute over the entire mirror support 100. However, due to the heat barriers 118a, 188b the heat produced at the target area 106 cannot easily flow sideward. Therefore the rise of temperature will be confined for a longer time to the space between the heat barriers 118a, 188b where it will cause, as a result of the different coefficients of thermal expansion of the material 124 and the mirror support 100, a bending of the mirror support 100 along a bending axis which runs perpendicular to the longitudinal direction of the target area 106. Eventually the heat will flow out of the space between the heat barriers 188a, 188b via contact sockets 126 which have a high coefficient of thermal conduction and connect the mirror support 100 to a heat sink 128.

Since the heat will be confined longer to the portion of the mirror support where it will result in a desired deformation of the mirror support, the refresh rate at which the laser beam 92 illuminates the target area 106 can be reduced.

A similar effect is also achieved with materials which have a non-isotropic coefficient of thermal expansion. For example, if the material 124 below the target area 106 has a lower coefficient of thermal expansion in the XZ plane than along an orthogonal direction, heat will flow away faster along the Z direction, i.e. via the sockets 126 into the heat sink 128, than into the adjacent material of the mirror support 100. Crystalline materials which can be epitaxially grown often have such a non-isotropic coefficient of thermal conduction.

It is to be understood that the aforementioned embodiments are only exemplary. For example, the shape of the reflective coating may (before or after increasing the temperature with the help of the temperature control device 90) be planar, rotationally symmetrically curved, ellipsoidal or saddle shaped, for example. In other embodiments the mirror support is only a thin membrane so as to increase the sensibility of the mirror element to deformations induced by temperature changes.

In still other embodiments the temperature control device includes cooling members such as channels within the mirror support through which a cooling fluid can flow.

Furthermore, it may also be envisaged to use the disclosure in mirror arrays that are arranged in projection objectives of microlithographic exposure apparatus. Although this is not presently claimed, the applicant reserves the right to broaden the claims in this direction. In this case the projection objective does not include a primary light source, and the mirror elements do not direct light towards the system pupil surface. Instead, the mirror array may itself be arranged in a pupil surface of the projection objective.

V. EUV Illumination System

The above embodiments of the disclosure all relate to DUV illumination systems. However, as will become clear from the embodiment described below, the disclosure may also advantageously be used in EUV illumination systems. In such systems the wavelength of the projection light (also referred to as the operating wavelength) is below 50 nm, preferably below 25 nm, and most preferably between 13 and 14 nm. Since no transparent refractive materials are available at such short wavelengths, all optical elements (except stops of course) in EUV projection exposure apparatus are of the catoptric (i.e. reflective) type.

Figure 11:
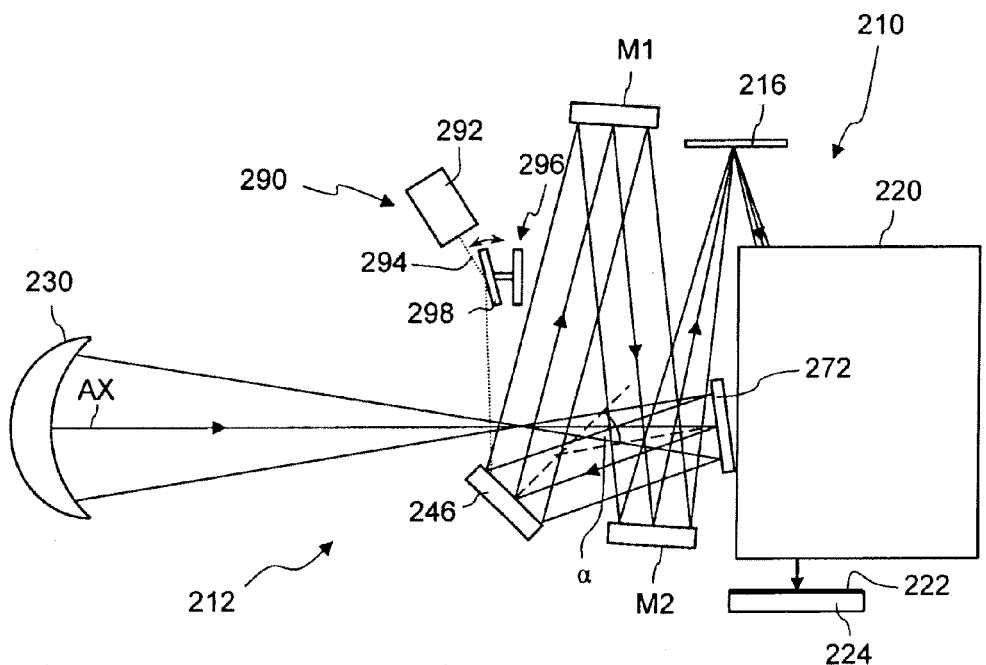
FIG. 11 is a schematic meridional section through an EUV projection exposure apparatus including as pupil defining mirror a mirror array with concave astigmatic mirror elements.

FIG. 11 is a schematic and not-to-scale meridional section through an EUV projection exposure apparatus which is denoted in its entirety by 210. The curvature and other details of the optical elements are not shown for the sake of simplicity. The EUV projection exposure apparatus 210 includes an illumination system 212 which illuminates a mask 216 which contains minute reflective structures and is arranged on a mask stage (not shown). Projection light reflected from the mask 216 enters a projection objective 220 which images the reflective structures illuminated on the reticle 216 on a light sensitive layer 222 which is applied on a substrate 224 arranged on a substrate stage (not shown).

The illumination system 212 includes a light source schematically indicated at 230 to which an axis of symmetry AX is associated. Usually this axis of symmetry AX coincides with an optical axis of a concave mirror which is contained in the light source 230. If there is no such mirror, this axis AX is defined by symmetry properties of the projection light beam as such.

Figure 12:
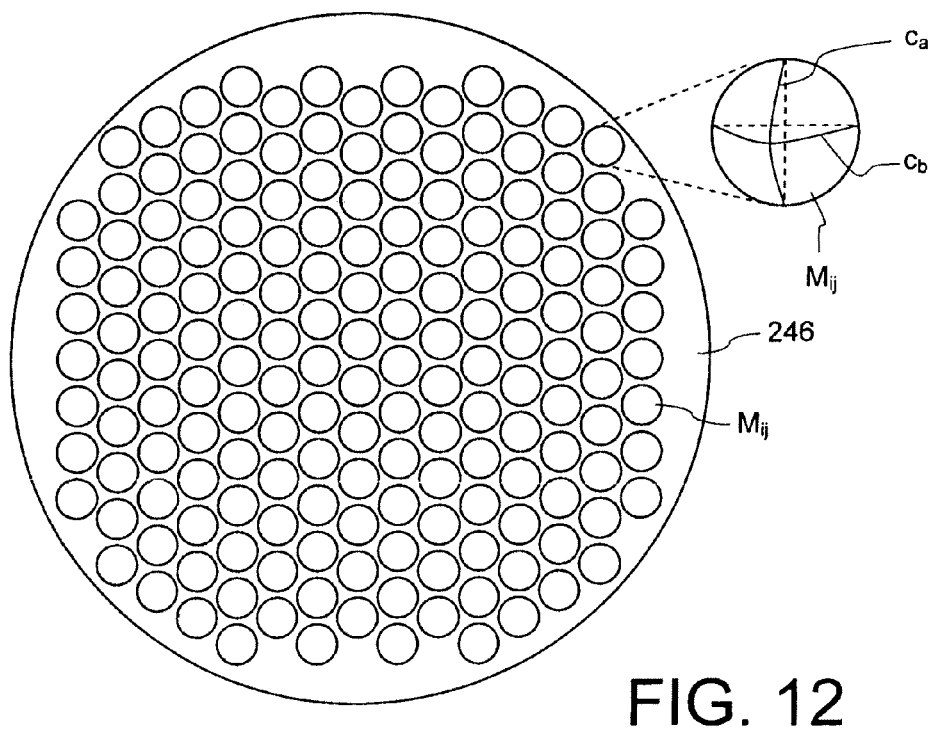
FIG. 12 is a top view of the mirror array shown in FIG. 11.

The light emitted by the light source 230 impinges on a field defining mirror 272 which may include an array of mirror elements (sometimes also referred to as mirror facets). After being reflected from the field defining mirror 272, the projection light impinges on a pupil defining mirror array 246. As shown in the top view of FIG. 12, the pupil defining mirror array 246 includes a plurality of concave mirror elements $M_{ij}$ which initially are all spherical or at least rotationally symmetrical. This implies that the curvatures $c_a$ and $c_b$ of the mirror elements $M_{ij}$ are identical in arbitrary pairs of orthogonal planes. Each mirror element $M_{ij}$ is tiltably mounted with respect to a support structure, includes a mirror support and a reflective coating and is configured to direct projection light towards a pupil surface of the illumination system 212. The EUV projection light is directed by the pupil defining mirror array 246 towards two mirrors M1 and M2 before it finally illuminates the mask 216.

The illumination system 210 further includes a temperature control device 290 which has, in the embodiment shown, essentially the same constitution as the temperature control device 90 shown in FIG. 2. Namely, the temperature control device 210 includes an infrared laser source 292 which produces a laser beam 294. The temperature control device 290 further includes a spatial light modulator 296 which is configured to move the laser beam 294 over target areas on the pupil defining mirror array 246. In this embodiment the spatial light modulator 296 includes a mirror 298 which can be tilted about two orthogonal axes with the help of suitable actuators. Thus it is possible to direct the laser beam 294 on any arbitrary point on the pupil defining mirror array 246 by suitably tilting the mirror 298. The wavelength of the light produced by the laser source 292 is selected such that it is almost completely, or at least by more than 80%, absorbed by the target areas on the pupil defining mirror array 246.

The remarkable feature of the pupil defining mirror array 246 is that the optical axes of the mirror elements $M_{ij}$ form a very large angle α (in the embodiment shown α~35°) with an optical axis of the field defining mirror 272 which immediately precedes the pupil defining mirror array 246 in a light propagation direction. If the preceding mirror includes mirror elements, this condition applies individually for the optical axes of the mirror elements irrespective of their tilting position. The angle α is preferably greater than 20°, more preferably greater than 30°.

This angle α, which is a measure for the beam deviation capability of the mirror array 246, is much larger than conventionally. In prior art EUV projection exposure apparatus the deviation angles α for all mirrors are kept as small as possible. This results in a light path which substantially runs up and down through the illumination system and also the projection objective, similar to what is shown in FIG. 11 for the light path between the mirror M1 and the mask 216. This, however, has the significant drawback that also the bulky light source has to be arranged either at the bottom (preferably even in a basement of the semiconductor facility) or at the top of the apparatus, where it involves a complex mounting structure.

The prior art illumination systems attempt to keep the deviation angles α as small as possible because larger deviation angles will result in aberrations if the involved mirrors have spherical mirror surfaces. The production of aspherical, and in particular of rotationally asymmetrical, mirrors is difficult and costly, and this particularly applies if a facetted mirror includes a large number of individual mirror elements, as is the case with the mirror arrays 246 and 272 shown in FIG. 11.

Figure 13:
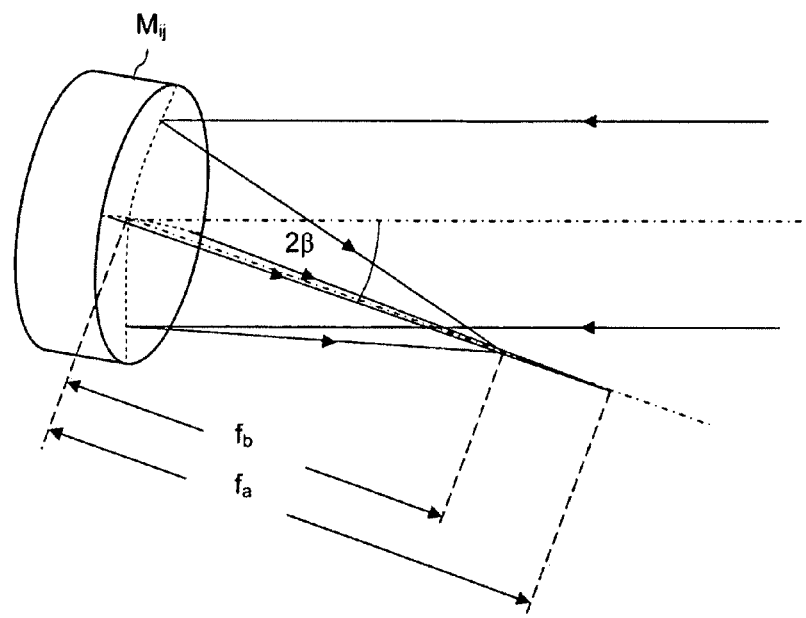
FIG. 13 is an enlarged perspective view of a mirror element of the mirror array shown in FIG. 12.

In the embodiment shown the deviation angle α is allowed to be large, because aberrations that would be introduced by the initially spherical or rotationally symmetrical mirrors are corrected with the help of the temperature control device 290 in the following manner:

When the projection exposure apparatus 210 is operated, the spatial light modulator 296 is controlled such that the laser beam 294 heats up the mirror elements $M_{ij}$ in a specific manner that will result in a deformation of the mirror elements $M_{ij}$. This deformation is determined such that the surface shape of the mirror elements $M_{ij}$ changes from rotationally symmetrical to astigmatic. To this end the target area on each individual mirror element $M_{ij}$ may have a geometry as it is shown in FIG. 6a, for example. Here the term "astigmatic" is used to indicate that the curvature of a mirror element $M_{ij}$ is different in two orthogonal planes (see curvatures $c_a$ and $c_b$ in the enlarged cutout in FIG. 12). Then the focal length $f_a$ of the mirror elements $M_{ij}$ in one plane will be larger than the focal length $f_b$ in an orthogonal plane, as is illustrated in the perspective view of FIG. 13. This difference between the focal lengths may be as large as 1% (i.e. $f_a > 1.01 \cdot f_b$) or even as large as 10%.

Preferably the deformations are determined such that the radii of curvature $R_a$, $R_b$ in the meridional and sagittal planes are given by $R_a = R/\cos(\beta)$ and $R_b = R \cdot \cos(\beta)$, with R being the radius of curvature of the spherical portion of the respective mirror and β being the angle of incidence. With such astigmatic reflecting surfaces of the mirror elements $M_{ij}$ of the pupil defining mirror array 246, aberrations are kept small even for larger deviation angles α.

It should be noted that achieving such small aberrations additionally involves that the focal length of the mirror be large compared to the illuminated surface on the mirror. With the mirror elements $M_{ij}$ of the field and pupil mirror arrays 272, 246 this condition is fulfilled, because their focal length is typically in the range of about 1 m, and the illuminated surface is small (typical diameters of the mirror elements are about a few millimeters up to a few centimeters). With the mirrors M1 or M2, however, larger deviation angles could not be achieved even if they had astigmatic mirror surfaces.

A larger deviation angle α makes it possible to arrange the light source 230 at a much more convenient height, as can be seen in FIG. 11. In this embodiment the axis of symmetry AX of the light source 230 runs substantially horizontally, and thus the light source 230 is arranged at the same height as the field defining mirror 272. In other embodiments the axis of symmetry AX forms an angle of less than 45°, preferably of less than 20°, with respect to a horizontal plane.

In EUV illumination systems there is often a desire to actively cool the mirror elements because a considerable portion of the impinging high energy EUV projection light is absorbed by the mirror elements. Thus the generation of heat with the help of a temperature control device 290 which additionally heats up the mirror elements $M_{ij}$ usually involves additional efforts to cool the mirror elements.

Figure 14:
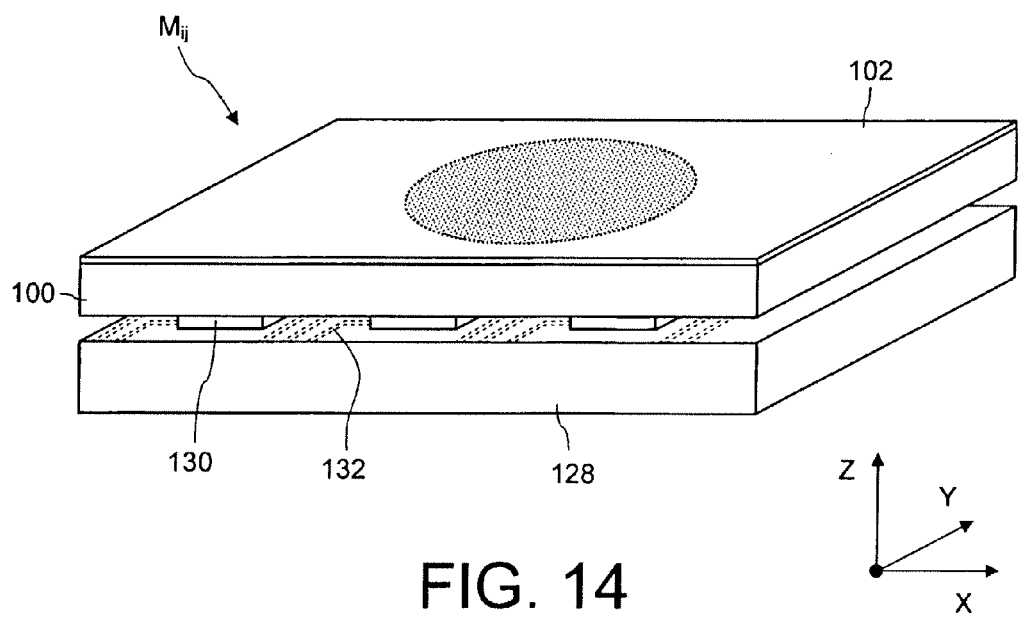
FIG. 14 is a perspective view of a mirror element according to an embodiment in which Peltier elements are used as cooling members.

FIG. 14 is a perspective view of a mirror element $M_{ij}$ according to another embodiment in which the temperature control device does not locally heat, but locally cools the mirror elements $M_{ij}$. To this end the temperature control device includes a plurality of micro Peltier elements 130 that connect the mirror support 100 to a heat sink 128. Such micro Peltier elements 130 are commercially available from MICROPELT GmbH, Freiburg, for example.

Each micro Peltier element 130 can be operated individually, which is indicated in FIG. 14 by wiring 132, and thus the mirror support 100 can be locally cooled so as to produce a wide variety of different temperature distributions. Also in this embodiment structures having different coefficients of thermal expansion will cause a desired deformation of the mirror support 100.

With the provision of the micro Peltier elements 130 an additional cooling system which may otherwise be necessary can be completely dispensed with.

It is also envisaged to combine the Peltier elements 130 or other cooling members with heating members or, even more advantageously, with the heat control system 290 as shown in FIG. 11. Then the mirror elements $M_{ij}$ may be (additionally) heated and cooled (quasi-)simultaneously. This which makes it possible to produce very large temperature differences and consequently large deformations of the mirror support.

The above description of the preferred embodiments has been given by way of example. From the disclosure given, those skilled in the art will not only understand the present disclosure and its attendant advantages, but will also find apparent various changes and modifications to the structures and methods disclosed. The applicant seeks, therefore, to cover all such changes and modifications as fall within the spirit and scope of the disclosure, as defined by the appended claims, and equivalents thereof.

What is claimed is:

1. An illumination system having a pupil surface, the illumination system comprising:
    a mirror array comprising a plurality of mirror elements, each mirror element comprising a mirror support and a reflective coating, and each mirror element being configured to direct light produced by a primary light source toward the pupil surface; and
    a temperature control device,
    wherein:
        each mirror element comprises structures that have different coefficients of thermal expansion;
        for each mirror element, the structures are fixedly attached to each other;
        the temperature control device comprises a radiation system configured to selectively direct radiation to target areas on the reflective coating and is configured to variably modify a temperature distribution within the structures of the mirror elements to individually change a shape of each mirror element;
        the mirror elements have concave mirror surfaces, and the temperature control device is configured to modify a temperature distribution within the structures so that the mirror elements have different focal lengths in two orthogonal planes; and
        the illumination system is configured to be used in a microlithographic projection exposure apparatus.

2. The illumination system of claim 1, further comprising the primary light source.

3. The illumination system of claim 1, wherein, for each mirror element, the structures comprise layers that form the reflective coating.

4. The illumination system of claim 1, wherein the reflective coatings are absorbent for the radiation.

5. The illumination system of claim 1, wherein the radiation system comprises:
    a secondary light source configured to produce a beam of the radiation; and
    a spatial light modulator configured to move the beam of the radiation over the target areas.

6. The illumination system of claim 1, wherein the target areas are different for different mirror elements.

7. The illumination system of claim 1, wherein the temperature control device is configured to predict a shape of the mirror elements by taking into account bending forces produced by the different coefficients of thermal expansion.

8. The illumination system of claim 1, wherein the temperature control device is configured to predict a shape of the mirror elements by taking into account bending forces produced by a non-homogenous temperature profile in the mirror elements.

9. The illumination system of claim 1, wherein the light has a wavelength below 50 nm, and optical axes of the mirror elements form an angle of more than 20° with an optical axis of a mirror which immediately precedes the mirror array in a propagation direction of the light.

10. The illumination system of claim 9, wherein an axis of symmetry is associated with the light source, and the axis of symmetry forms an angle of less than 45° with respect to a horizontal plane.

11. The illumination system of claim 1, wherein the mirror elements comprise heat barriers having a lower coefficient of thermal conduction than materials arranged on either side of the heat barriers.

12. The illumination system of claim 1, wherein each mirror element is tiltably mounted with respect to a support structure.

13. An apparatus, comprising:
    an illumination system according to claim 1; and
    a projection objective,
    wherein the apparatus is a microlithography projection exposure apparatus.

14. An illumination system having a pupil surface, the illumination system comprising:
    a mirror array comprising a plurality of mirror elements, each mirror element comprising a mirror support and a reflective coating, and each mirror element being configured to direct light produced by a primary light source toward the pupil surface; and
    a temperature control device,
    wherein:
        each mirror element comprises structures that have different coefficients of thermal expansion;
        for each mirror element, the structures are fixedly attached to each other;
        the temperature control device is configured to variably modify a temperature distribution within the structures of the mirror elements to individually change a shape of each mirror element;
        the mirror elements comprise heat barriers having a lower coefficient of thermal conduction than materials arranged on either side of the heat barriers;
        the heat barriers are integrated in the mirror support and adjoin the reflective coating; and
        the illumination system is configured to be used in a microlithographic projection exposure apparatus.

* * * * *

UNITED STATES PATENT AND TRADEMARK OFFICE
CERTIFICATE OF CORRECTION

PATENT NO. : 8,797,507 B2  Page 1 of 1
APPLICATION NO. : 13/044160
DATED : August 5, 2014
INVENTOR(S) : Florian Bach et al.

It is certified that error appears in the above-identified patent and that said Letters Patent is hereby corrected as shown below:

In the Specification

In Col. 11, lines 32-45, should be one paragraph.

In Col. 11, line 67, delete " $M_{ij}$:" and insert -- $M_{ij}$. --.

In Col. 13, line 26, delete "Also Also" and insert -- $M_{ij}$. Also --.

In Col. 15, line 42, delete "α~35°)" and insert -- α≈35°) --.

In Col. 16, line 8, delete "manner:" and insert -- manner. --.

Signed and Sealed this
Twenty-first Day of October, 2014

Michelle K. Lee
*Deputy Director of the United States Patent and Trademark Office*